(12) United States Patent
Chen

(10) Patent No.: US 6,211,067 B1
(45) Date of Patent: Apr. 3, 2001

(54) METHOD FOR MANUFACTURING METAL PLUG

(75) Inventor: Chang-Hui Chen, Tao-Yuan Hsien (TW)

(73) Assignee: Taiwan Semiconductor Mfg. Co., Ltd., Hsinchu (TW)

( * ) Notice: Subject to any disclaimer, the term of this patent is extended or adjusted under 35 U.S.C. 154(b) by 0 days.

(21) Appl. No.: 09/306,342

(22) Filed: May 6, 1999

(30) Foreign Application Priority Data

Apr. 7, 1999 (TW) ................................. 88105505

(51) Int. Cl.[7] ................................. H01L 21/4763
(52) U.S. Cl. ..................... 438/633; 438/691; 438/692
(58) Field of Search ..................... 438/633, 692, 438/693, 685, 691, 694

(56) References Cited

U.S. PATENT DOCUMENTS

| | | | |
|---|---|---|---|
| 5,164,330 | * | 11/1992 | Davis et al. . |
| 5,907,787 | * | 5/1999 | Sato ..................................... 438/622 |
| 5,942,449 | * | 8/1999 | Meikle ................................. 438/747 |
| 6,140,224 | * | 10/2000 | Lin ...................................... 438/634 |

* cited by examiner

Primary Examiner—Caridad Everhart
(74) Attorney, Agent, or Firm—Jiawei Huang; J C Patents

(57) ABSTRACT

A method for manufacturing a metal plug. The method includes the steps of providing a substrate having an insulation layer thereon, and then forming an opening in the insulation layer. Next, a conformal barrier layer is formed over the insulation layer and the sidewalls of the opening, and then metal is deposited to fill the opening and cover the barrier layer. Thereafter, the metallic layer above the barrier layer is etched back so that a metal plug is formed inside the opening. Finally, a chemical-mechanical polishing operation is carried out using the insulation layer as a polishing stop. A low polishing speed is used in the polishing operation so that a highly planar metal plug surface is obtained.

6 Claims, 2 Drawing Sheets

METHOD FOR MANUFACTURING METAL PLUG

CROSS-REFERENCE TO RELATED APPLICATION

This application claims the priority benefit of Taiwan application serial no. 88105505, filed Apr. 7, 1999 the full disclosure of which is incorporated herein by reference, the full disclosure of which is incorporated herein by reference.

BACKGROUND OF THE INVENTION

1. Field of Invention

The present invention relates to a method for manufacturing a semiconductor device. More particularly, the present invention relates to a method for manufacturing a metal plug.

2. Description of Related Art

In general, a metal plug is formed by first etching an insulation layer to form an opening and then forming a conformal barrier layer over the insulation layer and the sidewalls of the opening. Next, metal is deposited to fill the opening and cover the barrier layer. Finally, that portion of the metallic layer above the barrier layer is removed so that a metal plug is formed inside the opening.

There are several methods to remove the metallic material above the insulation layer. For example, one method of forming a tungsten plug is to etch back a portion of the tungsten layer using fluoride-containing plasma. However, due to the high reactivity of fluoride plasma, the upper surface of the tungsten plug may cave in a little. Therefore, a difference in height of up to about 1000 Å between the tungsten plug surface and its neighboring barrier layer is possible.

A second method is to polish the barrier layer using a chemical-mechanical polishing (CMP) operation after the tungsten layer is etched back so that the degree of concavity on the upper surface of the tungsten plug is reduced. However, the barrier layer of a tungsten plug is usually a titanium nitride layer while the insulation layer is normally a silicon oxide layer. Since titanium nitride and silicon oxide are materials having similar polishing rates in a CMP operation, a portion of the oxide insulation layer on each side of the tungsten plug will also be removed after the titanium nitride barrier layer is removed. In other words, the tungsten plug will protrude above the oxide insulation layer after the polishing operation, and often can be as high as 1500 Å. Because of the concavity of plug surface and its protrusion above the insulation layer, only a rough surface can be formed. Subsequently, when a photolithographic operation is carried out to pattern out conductive lines, light will likely be defocused since the surface is rough. Consequently, shapes and positions of those conductive lines will be somewhat affected and product quality will be compromised.

An alternative method is to polish the tungsten layer using CMP at the very start, and then perform a CMP touch-up operation at a slower polishing speed thereafter. This method is able to obtain a highly planar tungsten plug surface with a maximum variation within a range of about 200 Å to 300 Å. However, the cost can be as high as US$ 35 per silicon wafer.

In light of the foregoing, there is a need to provide a method of manufacturing a metal plug that can lower the cost of production.

SUMMARY OF THE INVENTION

The invention provides a method for manufacturing a metal plug. The method includes the steps of providing a substrate having an insulation layer thereon, and then forming an opening in the insulation layer. Next, a conformal barrier layer is formed over the insulation layer and sidewalls of the opening. Thereafter, metal is deposited to fill the opening and cover the barrier layer, and then a first etching back operation of the metallic layer is performed. The metallic layer is etched to the barrier layer forming a metal plug. Subsequently, a second etching back operation is carried out to remove the exposed barrier layer above the insulation layer. Finally, the metal plug and the insulation layer are planarized.

According to the method of this invention, the metallic layer and the barrier layer above the insulation layer are first removed by etching before the entire insulation layer containing the metal plug is planarized using a chemical-mechanical polishing operation. The cost of production can be reduced to about US$ 4 to US$ 5 per silicon wafer. Moreover, production time is shortened, and hence productivity is increased considerably.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
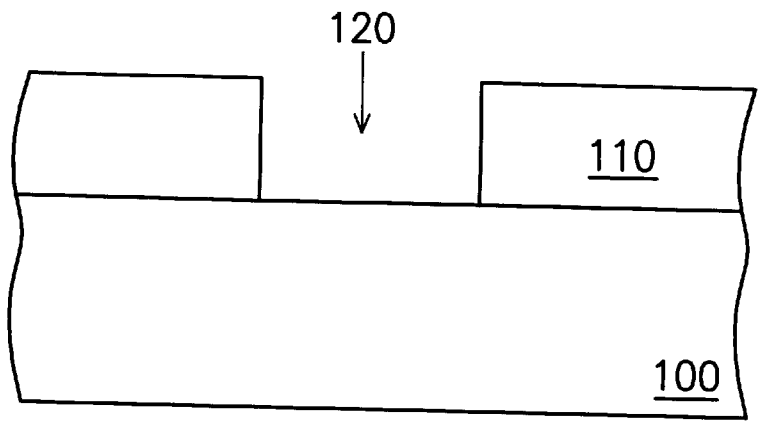
FIGS. 1A through 1E are schematic, cross-sectional views showing the progression of manufacturing steps in producing a metal plug according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views showing the progression of manufacturing steps in producing a metal plug according to one preferred embodiment of this invention.

As shown in FIG. 1A, a substrate 100 having an insulation layer 110 thereon is provided. An opening 120 is formed in the insulation layer 110. The insulation layer 110 can be a silicon oxide layer, for example, formed using tetraethyl orthosilicate (TEOS, $Si(OC_2H_5)_4$) as a reactive gas in a low-pressure chemical vapor deposition (LPCVD) operation.

Figure 1B:
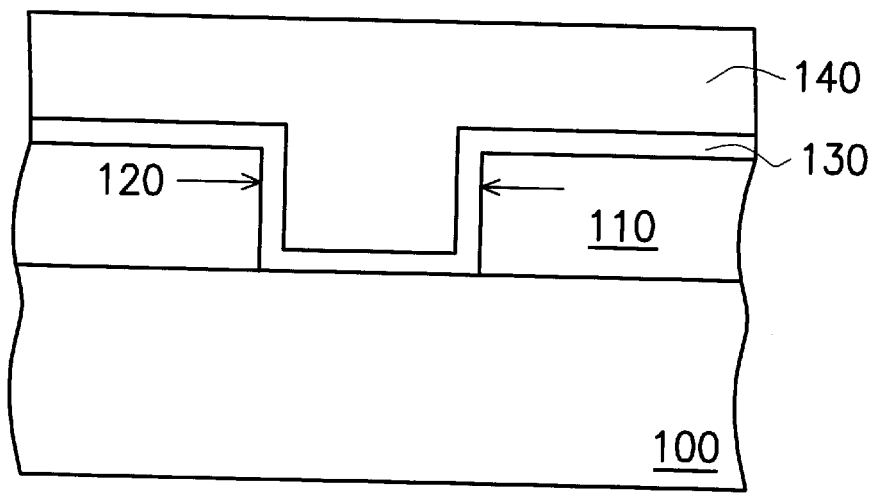

As shown in FIG. 1B, a conformal barrier layer 130 is formed over the insulation layer 110 and the sidewalls of the opening 120. The barrier layer 130 can be a titanium nitride layer, for example, formed by sputtering. Thereafter, metal is deposited into the opening 120 over the barrier layer 130 to form a metallic layer 140. The metallic layer can be a tungsten layer, for example, formed using tungsten hexafluoride ($WF_6$) as the main reactive gas in a chemical vapor deposition (CVD) operation.

Figure 1C:
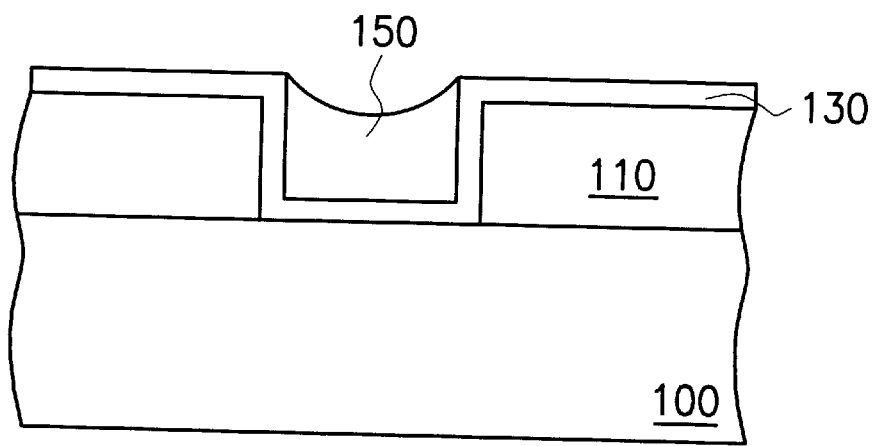

As shown in FIG. 1C, the metallic layer 140 is etched back to the barrier layer 130 to form a metal plug 150. If the metallic layer 140 is a tungsten layer, the etching back operation can be carried out using $SF_6/O_2/Ar$ plasma in a dry etching operation.

Figure 1D:
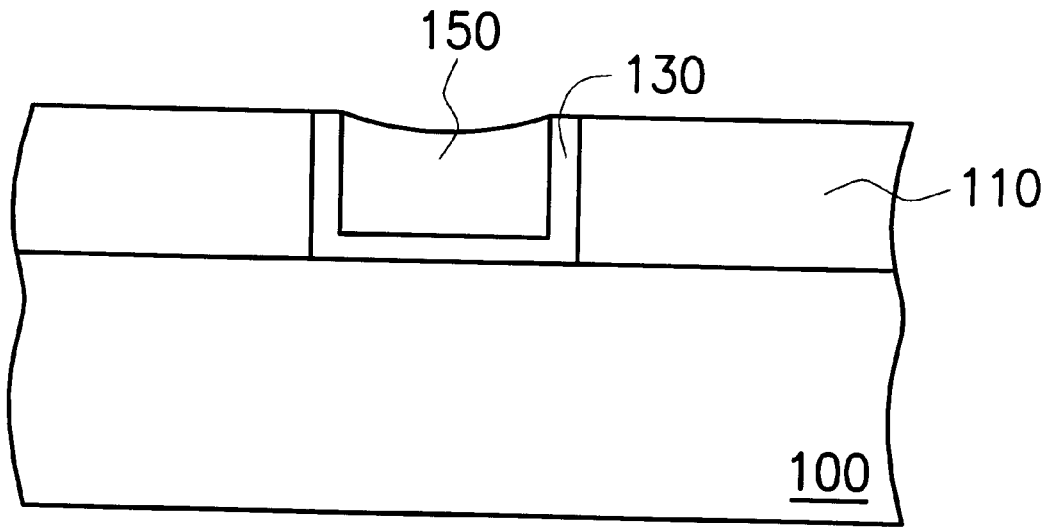

As shown in FIG. 1D, the exposed barrier layer 130 is etched back to the insulation layer 110 to reduce the degree of concavity on the metal plug 150 surface. If the barrier layer 130 is a titanium nitride layer, the etching back operation can be carried out using $Cl_2/BCl_3$ plasma in a dry etching operation.

Figure 1E:
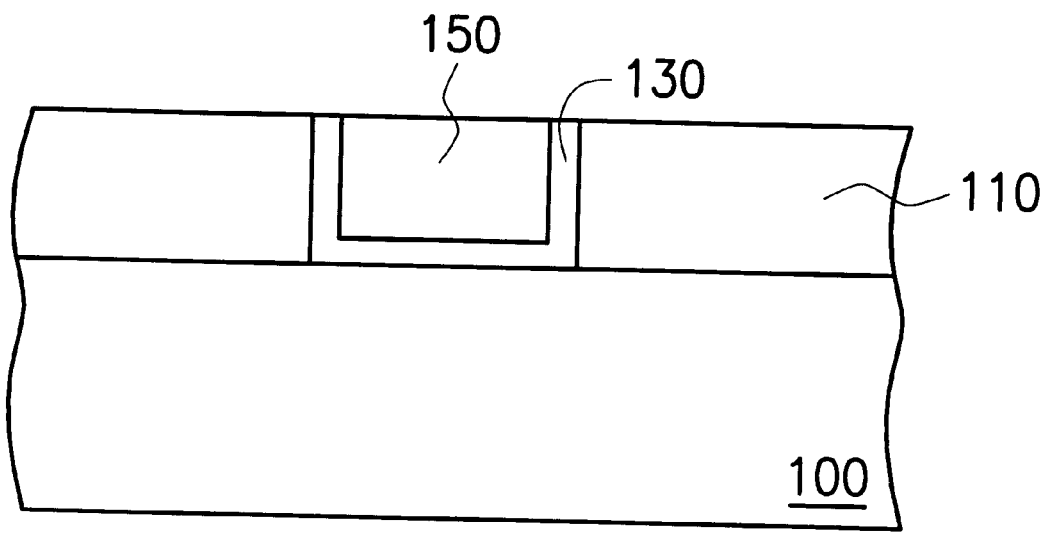

As shown in FIG. 1E, the metal plug 150 and the insulation layer 110 are planarized. For example, the insulation layer 110 containing the metal plug 150 can be planarized by chemical-mechanical polishing (CMP), and the CMP operation can be carried out at a lower polishing rate. Hence, the metal plug 150 and its surrounding insulation layer can form a highly planar surface.

In summary, the step of removing the metallic layer and the barrier layer above the insulation layer by etching according to this invention is able to reduce cost and shorten production time. The subsequent planarization of the insulation layer and metal plug by CMP is able to produce a highly planar surface. Consequently, when photolithographic procedures for patterning out conductive lines are carried out, finer conductive lines can be obtained.

It will be apparent to those skilled in the art that various modifications and variations can be made to the structure of the present invention without departing from the scope or spirit of the invention. In view of the foregoing, it is intended that the present invention cover modifications and variations of this invention, provided they fall within the scope of the following claims and their equivalents.

What is claimed is:

1. A method for manufacturing a metal plug, comprising the steps of:

provinding a substrate having an insulation layer thereon;

forming an opening in the insulation layer;

forming a conformal barrier layer over the insulation layer and sidewalls of the opening;

depositing metal over the barrier layer and filling the opening to form a metallic layer;

performing a first etching back operation to remove a portion of the metallic layer above the barrier layer to form a metal plug;

performing a second etching back operation to remove a portion of the exposed barrier layer; and planarizing the metal plug and the insulation layer by performing a chemical-mechanical polishing operation using the insulation layer as a polishing stop.

2. The method of claim 1, wherein the step of forming the metallic layer includes depositing tungsten by a chemical vapor deposition.

3. The method of claim 2, wherein the step of performing the first etching back operation includes dry etching using SF6/O2/Ar plasma.

4. The method of claim 1, wherein the step of forming the barrier layer includes depositing titanium nitride by sputtering.

5. The method of claim 4, wherein the step of performing the second etching back operation includes dry etching using Cl2/BCl3 plasma.

6. A method for manufacturing a tungsten plug having a planar surface inside an opening in an insulation layer above a substrate, comprising the steps of:

forming a conformal titanium nitride layer over the insulation layer and the sidewalls of the opening;

depositing tungsten over the titanium nitride layer and filling the opening to form a tungsten layer;

performing an etching back operation on the tungsten with the titanium nitride layer serving as an etching stop such that a metal plug is finally formed inside the opening;

removing the exposed titanium nitride layer; and polishing the tungsten plug by performing a chemical-mechanical polishing operation using the insulation layer as a polishing stop.

\* \* \* \* \*